(12) United States Patent
Zhu et al.

(10) Patent No.: US 9,571,059 B2
(45) Date of Patent: Feb. 14, 2017

(54) PARALLEL VIA TO IMPROVE THE IMPEDANCE MATCH FOR EMBEDDED COMMON MODE FILTER DESIGN

(71) Applicant: Intel Corporation, Santa Clara, CA (US)

(72) Inventors: Jianfang Olena Zhu, Hillsboro, OR (US); Chung-Hao Joseph Chen, Portland, OR (US); Ana M. Yepes, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 39 days.

(21) Appl. No.: 14/672,138

(22) Filed: Mar. 28, 2015

(65) Prior Publication Data

US 2016/0285428 A1    Sep. 29, 2016

(51) Int. Cl.
| | | |
|---|---|---|
| *H01P 5/12* | (2006.01) | |
| *H03H 7/38* | (2006.01) | |
| *H03H 7/01* | (2006.01) | |
| *H05K 1/02* | (2006.01) | |

(52) U.S. Cl.
CPC .......... *H03H 7/383* (2013.01); *H03H 7/0123* (2013.01); *H05K 1/0216* (2013.01)

(58) Field of Classification Search
CPC ..... H03H 7/383; H03H 7/0123; H05K 1/0216
USPC ....................................................... 333/126
See application file for complete search history.

(56) References Cited

U.S. PATENT DOCUMENTS

| | | | |
|---|---|---|---|
| 6,787,710 B2* | 9/2004 | Uematsu ................ | H05K 1/115 174/255 |
| 8,922,303 B2* | 12/2014 | Kameya .............. | H01P 1/20345 333/12 |
| 9,013,891 B2* | 4/2015 | Song ....................... | H01P 1/047 361/748 |
| 2003/0043001 A1* | 3/2003 | Aruga ....................... | H01P 5/08 333/246 |
| 2006/0090933 A1* | 5/2006 | Wig ....................... | H05K 1/0216 174/262 |
| 2011/0203843 A1* | 8/2011 | Kushta .................. | H05K 1/0219 174/377 |
| 2013/0056255 A1* | 3/2013 | Biddle .................. | H05K 1/0245 174/266 |
| 2013/0112465 A1* | 5/2013 | Duvanenko .......... | H05K 1/0216 174/260 |
| 2013/0228366 A1* | 9/2013 | Lam ...................... | H05K 1/0245 174/260 |

(Continued)

*Primary Examiner* — Robert Pascal
*Assistant Examiner* — Kimberly Glenn
(74) *Attorney, Agent, or Firm* — Carrie A Boone PC

(57) ABSTRACT

A parallel via design is disclosed to improve the impedance match for embedded common mode choke filter designs. Particularly suited to such designs on four-layer printed circuit boards, the parallel via design effectively suppresses the reflection of the differential pair. By connecting the vias in parallel, the inductance of the entire via structure is reduced while its capacitance is simultaneously increased. By properly choosing the number of parallel vias and the spacing between them, the impedance of the parallel vias can be well controlled within the frequency range of interest. Consequently, the impedance match can be improved and the return loss of a four-layer printed circuit board common mode choke filter design is reduced.

19 Claims, 15 Drawing Sheets

(56) References Cited

U.S. PATENT DOCUMENTS

2015/0325901 A1* 11/2015 Hidaka .................. H05K 3/40
333/238

* cited by examiner

US 9,571,059 B2

PARALLEL VIA TO IMPROVE THE IMPEDANCE MATCH FOR EMBEDDED COMMON MODE FILTER DESIGN

TECHNICAL FIELD

This application relates to common mode choke, high-speed signals, printed circuit boards, vias, and radio frequency interfaces.

BACKGROUND

Radio Frequency Interference (RFI) often causes performance degradation in high-speed signals such as those under the universal serial bus (USB) 3, high definition multimedia interface (HDMI), display port (DP), and enhanced DP (eDP) standards. For example, USB3 running at five gigabits per second (Gbps) can cause wireless communication user experience issues. Therefore, the use of common mode choke (CMC) filters in high-speed signals is highly recommended to mitigate RFI.

Traditionally, original design manufacturers (ODMs) use discrete CMC filters (CMGs) to suppress the common-mode noise and avoid possible degradation of wireless signals. However, discrete CMGs add significantly to the bill of materials (BOM) costs since they are typically about ten times more expensive than other passive surface mount technology (SMT) components, such as resistors and capacitors.

Printed circuit board (PCB) based CMC technology has been developed as an alternative to discrete CMGs, with the goal of helping customers significantly save on BOM costs while at the same time guaranteeing platform designs that are robust against RFI. This customized solution has been implemented in multiple ultrabook and tablet-based platforms having six-, eight-, and ten-layer PCBs.

Recently, the PCB-CMC solution has developed for four-layer boards, which are typically used in lower cost platforms, desktops, and all-in-one (AIO) systems. FIG. 1 shows a PCB-CMC four-layer design 50 with above−1 deciBel (dB) differential insertion loss (SDD21) up to 5 gigaHertz (GHz) and −10 dB filter bandwidth from 1.8 GHz to 9 GHz. SDD21, an industry notation for differential insertion loss, describes how the differential signal changes after transmission through a channel (the electrical path of the signal). SDD21 thus quantifies how well the channel transmits the differential signal.

The design of FIG. 1 effectively mitigates RFI. However, the differential pair of this design has a high return loss: about −10 dB from 4 GHz to 5 GHz, which is much higher than the design specification of −15 dB. This high return loss negatively impacts the high speed I/O signal integrity and hinders the adoption of the four-layer PCB-CMC.

The electrical pathway of a signal between layers of a multiple-layer printed circuit board (PCB) is known as a via. Thus, the channel being measured includes the via or vias when present. Studies show that high inductance of the vias is the major contributor to the impedance mismatch and consequently the high reflection characterizing the four-layer PCB-CMC designs.

To suppress the high reflection within the frequency range of interest, i.e., from direct current (DC) to 5 GHz, one solution is to increase the drill diameter to reduce inductance and hence lower the impedance mismatch. However, due to manufacturing limitations, the change of the drill size cannot be dramatic. Therefore, the improvement achieved by using this solution is small.

FIG. 2 is a graph 150 plotting frequency (GHz) versus magnitude (dB) for two drill diameters, 8 mil and 10 mil (one mil is one thousanth of an inch). Both 8 mil and 10 mil designs have a large differential return loss, known in industry parlance as SDD11: around −10 dB from 4 GHz to 5 GHz. SDD11 describes the differential signal that reflects back to the source, when a differential signal is incident at the beginning of the channel. Like differential insertion loss (SDD21), differential return loss (SDD11) provides a characteristic of the channel being measured, in this case, its impedance profile.

Another solution for avoiding a high return loss in four-layer PCB-CMC designs is to reduce the anti-pad size of the vias. An anti-pad is a clearance in a copper plane that will allow a drilled hole to pass through the copper plane without making a connection to an electrical pathway. A smaller anti-pad size results in a smaller current loop and, consequently, a smaller inductance.

FIG. 3 is a second graph 200 plotting frequency (GHz) versus magnitude (dB) for anti-pad diameters of 26 mil and 32 mil. Measurements for differential mode return loss (SDD11), differential mode insertion loss (SDD21), and common mode insertion loss (SCC21) are provided for two antipad sizes, 26 mil antipad (solid lines) and 32 mil antipad (dashed lines).

As highlighted in the oval at the top of the graph, a 26 mil anti-pad can reduce the differential return loss (SDD11) by around 3 dB from 2.5 GHz to 6 GHz. The darker lines in the oval show the differential mode return loss (which can be thought of as transmitted energy) for a 26 mil antipad (solid) and a 32 mil antipad (dashed). The lighter lines in the oval show the differential mode insertion loss (which can be thought of as reflected energy) for the two antipads. Both differential mode return loss (reflected energy) and differential mode insertion loss (transmitted energy) increases as the value becomes more negative.

The oval covers the frequency range of about 4.6 GHz-5 GHz, where the differential mode return loss is −5 dB for the 32 mil antipad versus −8 dB for the 26 mil antipad. Since the differential mode return loss increases as the value becomes more negative, the differential mode return loss is higher for the 26 mil antipad. The differential mode insertion loss is −3 dB for the 32 mil antipad versus −2 dB for the 26 mil antipad. Since the differential mode insertion loss increases as the value becomes more negative, the differential mode insertion loss is lower for the 26 mil antipad. Because it maximizes the SDD11 and minimizes the SDD21 (most of the energy gets transmitted, not reflected) relative to the 32 mil antipad, the 26 mil antipad is preferred for the indicated frequency range. A loss increase is defined herein as more negative whereas a loss reduction is more positive.

Despite these benefits, manufacturing constraints also limit the improvement achieved by reducing the anti-pad size. With 26 mil anti-pads implemented in four-layer PCB-CMC, the return loss is still 5 dB higher than the specification from 4 GHz to 5 GHz.

Thus, there is a continuing need for a solution that overcomes the shortcomings of the prior art.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a parallel via design is disclosed to improve the impedance match for embedded common mode choke (CMC) filter designs. Particularly suited to CMC designs on four-layer PCBs (CMC-PCB), the parallel via design effectively suppresses the reflection of the differential pair. By connecting the vias in parallel, the inductance of the entire via structure is reduced while its capacitance is simultaneously increased. By properly choosing the number of parallel vias and the spacing between them, the impedance of the parallel vias can be well controlled within the frequency range of interest. Consequently, the impedance match can be greatly improved and the return loss of a four-layer PCB-CMC is dramatically reduced. This novel technique effectively adjusts the electrical property of vias to mitigate the impedance mismatch in the four-layer PCB-CMC design.

In the following detailed description, reference is made to the accompanying drawings, which show by way of illustration specific embodiments in which the subject matter described herein may be practiced. However, it is to be understood that other embodiments will become apparent to those of ordinary skill in the art upon reading this disclosure. In other instances, well-known structures, materials, or operations are not shown or described in detail to avoid obscuring aspects of the invention. The following detailed description is, therefore, not to be construed in a limiting sense, as the scope of the subject matter is defined by the claims.

As disclosed in the background section, a via is an electrical pathway that is disposed between layers of a multiple-layer PCB. Along with the metal traces along the surface(s) of the PCB, the via is part of the channel through which a signal travels between circuits. The via consists of a barrel, an upper pad, a lower pad, and an anti-pad. The barrel is a tube made from conductive material, such as copper, that fills the hole drilled orthogonally through the PCB. The upper and lower pads, disposed on either end of the barrel, connects the barrel to either a circuit or a trace. The anti-pad is a clearance hole disposed between the barrel and a PCB layer to which the via is not to be connected. The anti-pad thus isolates the via from the PCB where needed.

Figure 4:
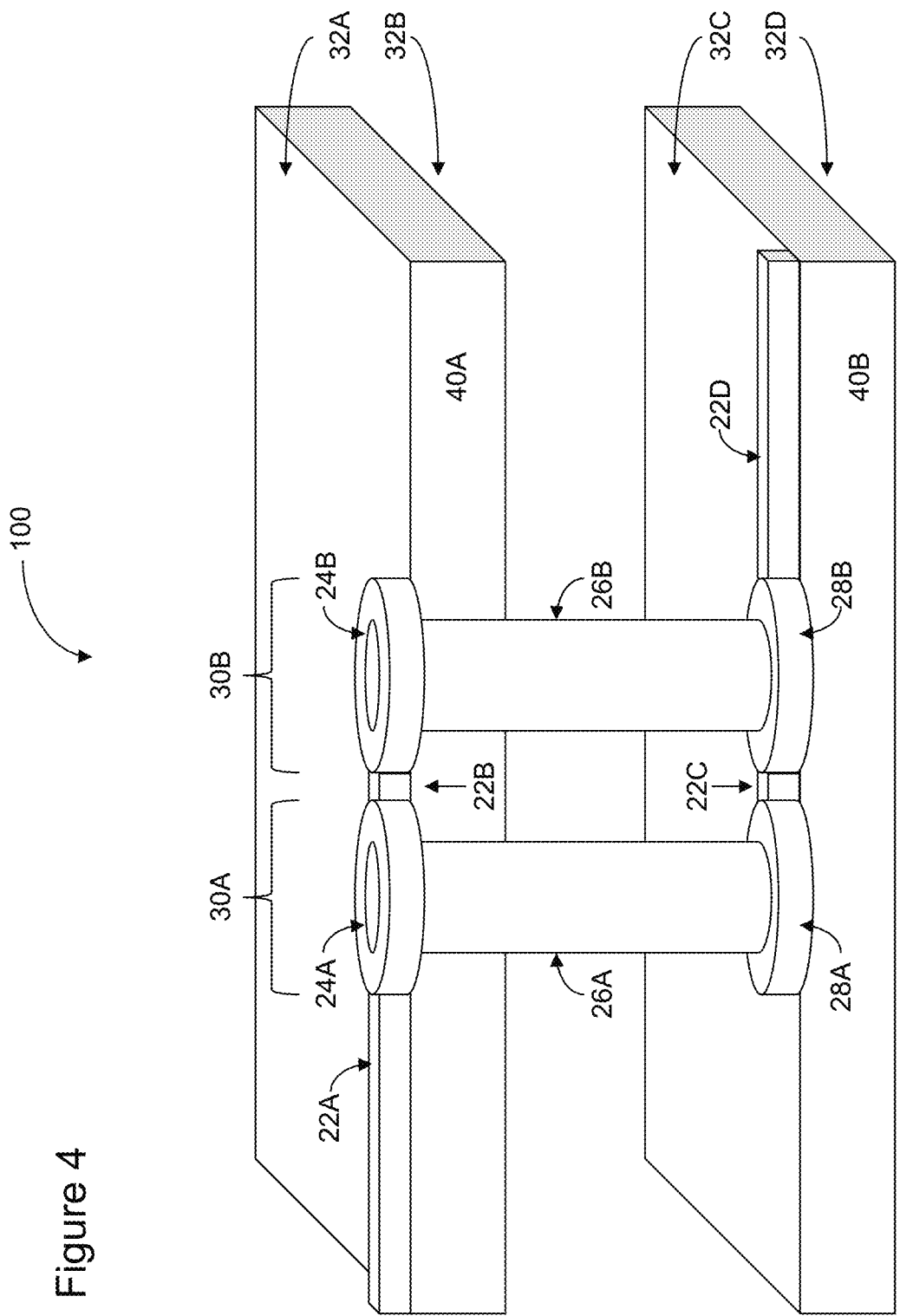
FIG. 4 is a simplified diagram of a parallel via design employing two parallel vias, according to some embodiments.

To enable a four-layer PCB-CMC design and hence save BOM costs, parallel vias are used, in some embodiments. FIG. 4 is a simplified perspective drawing of a parallel via design in a PCB-based system, according to some embodiments. The individual components of this illustration are merely representative. Some components are exaggerated in size and the scale relative to other components. The system 100 is a PCB containing differential traces for high-speed signals, in which the PCB-CMC can be realized, the PCB having at least four layers (two signal layers and two ground/power layers).

The parallel via design 100 consists of two vias 30A and 30B (collectively, "vias 30") that are disposed orthogonally between two layers 32A and 32C of a four-layer printed circuit board (PCB) having four layers 32A, 32B, 32C, and 32D (collectively, "layers 32", "surfaces 32", or "PCB surfaces 32"). Two physical boards 40A and 40B provide the four layers or surfaces 32, with board 40A having an upper layer 32A and a lower layer 32B and board 40B having an upper layer 32C and a lower layer 32D (collectively, "boards 40" or "PCBs 40").

In FIG. 4, the vias 30 are depicted as being disposed between the first 32A and third 32C layers of the PCBs 40. However, the vias 30 may also provide electrical connectivity between circuits on the first 32A and second 32B layers, the second and third 32C layers, the third and fourth 32D layers, the first and fourth layers, and the second and third layers (not shown).

The vias 30 consist of upper pads, barrels, lower pads, and, where appropriate, anti-pads. Anti-pads are needed, for example, when a signal via goes through a ground plane. Otherwise, there would be a short. In FIG. 4, via 30A consists of upper pad 24A, barrel 26A, and lower pad 28A while adjacent via 30B consists of upper pad 24B, barrel 26B, and lower pad 28B (collectively, "upper pads 24", "barrels 26" and "lower pads 28"). The vias are orthogonal to the electrical pathways to which they connect, with the electrical pathways generally being upon the surface and thus parallel to the PCBs 40. (Since connection to the second layer 32B of the PCB is not made, the vias 30 may appropriately include anti-pads at the second layer, although this is not shown in FIG. 4. Instead, anti-pads are described below and illustrated in FIG. 8.)

Channels 22A-22D in FIG. 4 are electrically conductive pathways to enable an electrical signal to be transmitted, along with the electrically conductive vias 30, between circuits on the PCBs 40 (collectively, "channels 22"). Generally, the channels 22 consist of copper wire disposed upon layers 32 of the PCBs 40 (known also as traces). In an example, an electrical signal may flow through channel 22A to the upper pad 24A of the via 30A, down the barrel 26A and through the channel 22B to the upper pad 24B of the second via 30B, down the barrel 26B (thus, the electrical signal is flowing through the two barrels). At the bottom of the vias 30, the electrical signal is flowing through both lower via pads 28 and the channel 22C and finally into the channel 22D. The transmission of the electrical signal may also take place in reverse. Like the channels 22, the vias 30 are also made of electrically conductive material, such as copper.

In some embodiments, the parallel vias 30 in the system 100 effectively suppress the reflection of differential pairs of electrical signals. With vias connected in parallel, the inductance of the entire via structure is reduced, in some embodiments. Meanwhile, the capacitance of the same parallel vias is increased, in some embodiments.

Figure 5:
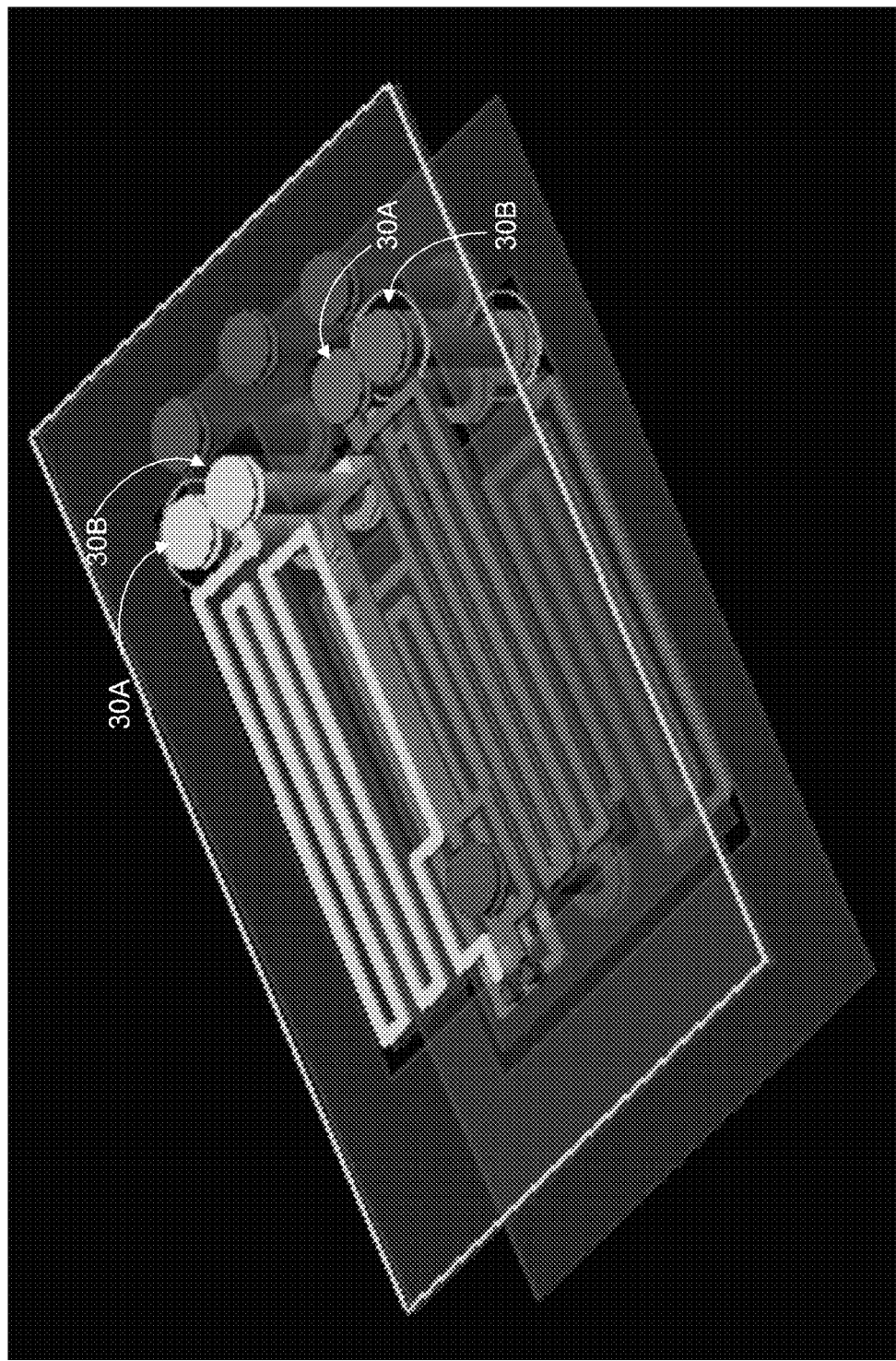
FIG. 5 is a perspective depiction of a PCB-CMC four-layer design using the parallel via design of FIG. 4, according to some embodiments.

FIG. 5 is a perspective depiction of a system 100A having parallel vias 30, according to some embodiments. Two sets of parallel vias 30A and 30B are shown, one for each differential signal. Two vias are placed adjacent and parallel to one another, and then connected together, to form a large paralleled via.

With parallel vias implemented in four-layer PCB-CMC, as depicted in the system 100A of FIG. 5, the return loss is dramatically reduced to below −15 dB from DC to 5 GHz, in some embodiments. Good signal integrity is ensured and a good common mode filter performance is maintained implementing the parallel via design. The parallel vias 30 enable a four-layer PCB-CMC to be utilized in high-speed input/output (I/O) devices such as USB 3.1 and HDMI, in some embodiments.

Figure 6:
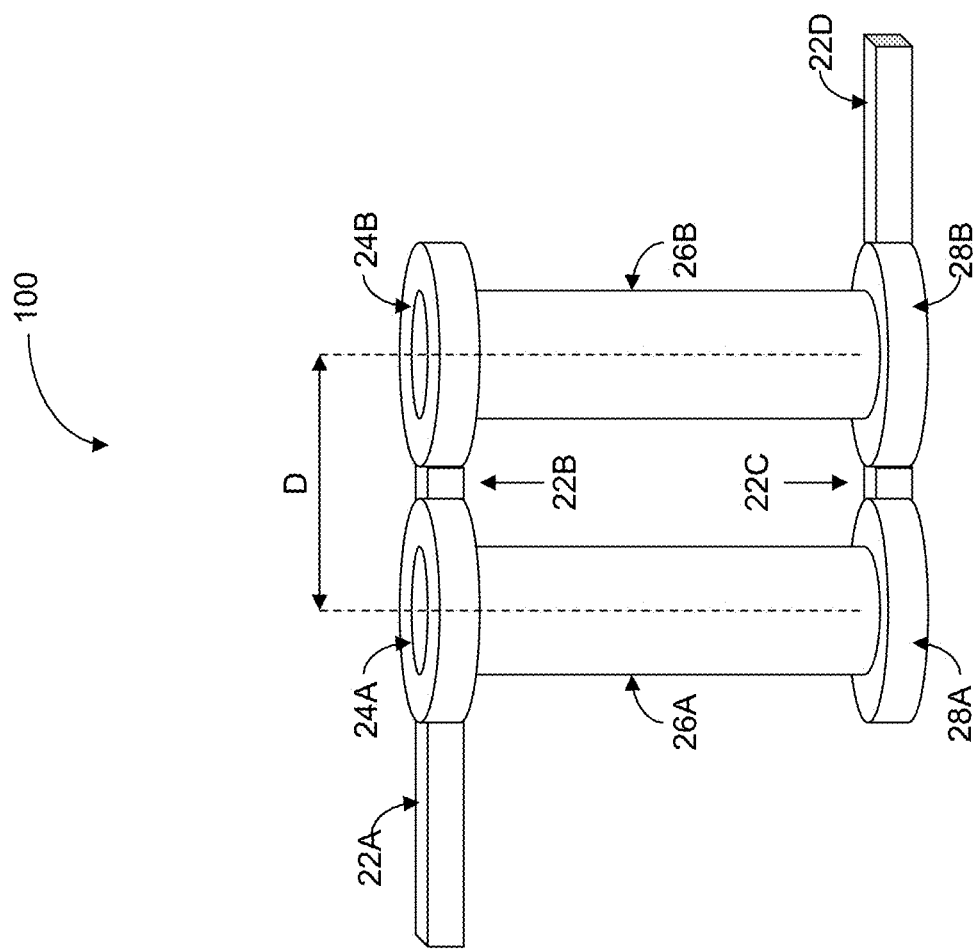
FIG. 6 is a simplified diagram of the parallel via design of FIG. 4, used to illustrate a distance characteristic, according to some embodiments.
Figure 7:
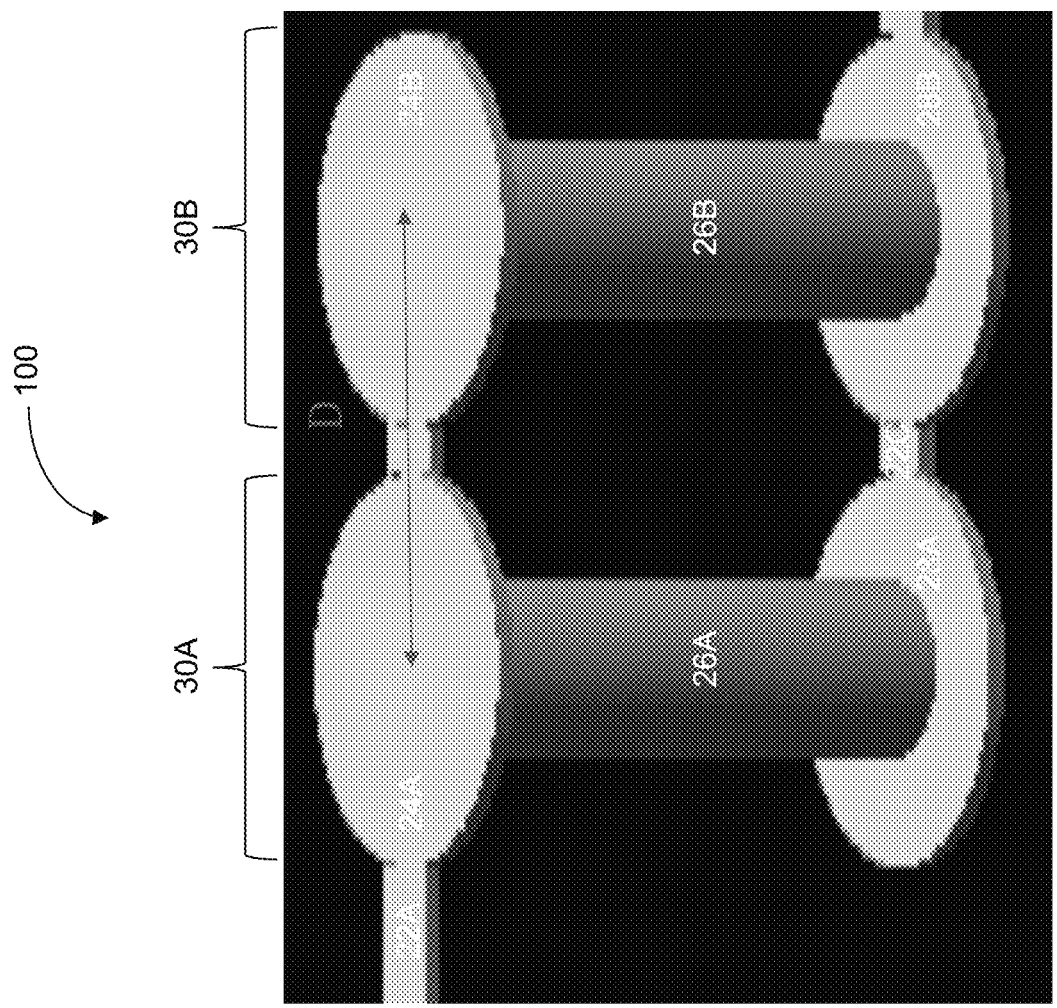
FIG. 7 is a perspective depiction of the parallel via design of FIG. 4, also used to illustrate the distance characteristic, according to some embodiments.

In some embodiments, by properly choosing the number of parallel vias and the spacing between them, the impedance of the parallel vias can be well controlled within the frequency range of interest. FIG. 6 is a simplified diagram of the system 100, including the two parallel vias 30, according to some embodiments. A measurement D is taken from the center of each via 30A and 30B. This measurement D is the spacing between the center of each parallel via 30 that is adjustable in order to control the impedance within a given frequency range. By adjusting this measure, D, the impedance match can be improved such that the return loss of a four-layer PCB-CMC is dramatically reduced, in some embodiments. This novel technique effectively adjusts the electrical property of the vias 30 to mitigate the impedance mismatch in the four-layer PCB-CMC design. FIG. 7 is a perspective view of the two parallel vias 30, with the measurement D again being shown.

Compared to a single via, the overall inductance of the parallel vias 30 of FIG. 4, and further illustrated in FIGS. 5-7, is smaller and the capacitance is larger, as compared to a single via implementation. The spacing, given by the length, D, between the two vias is precisely determined, in some embodiments. The smaller the D length (within the manufacturing tolerance range), the smaller the inductance is and the smaller the reflectance is, from 3 GHz to 5 GHz.

Therefore, in four-layer PCB-CMC designs, a D value of 20 mils or less is used to minimize the return loss, in some embodiments.

Figure 8:
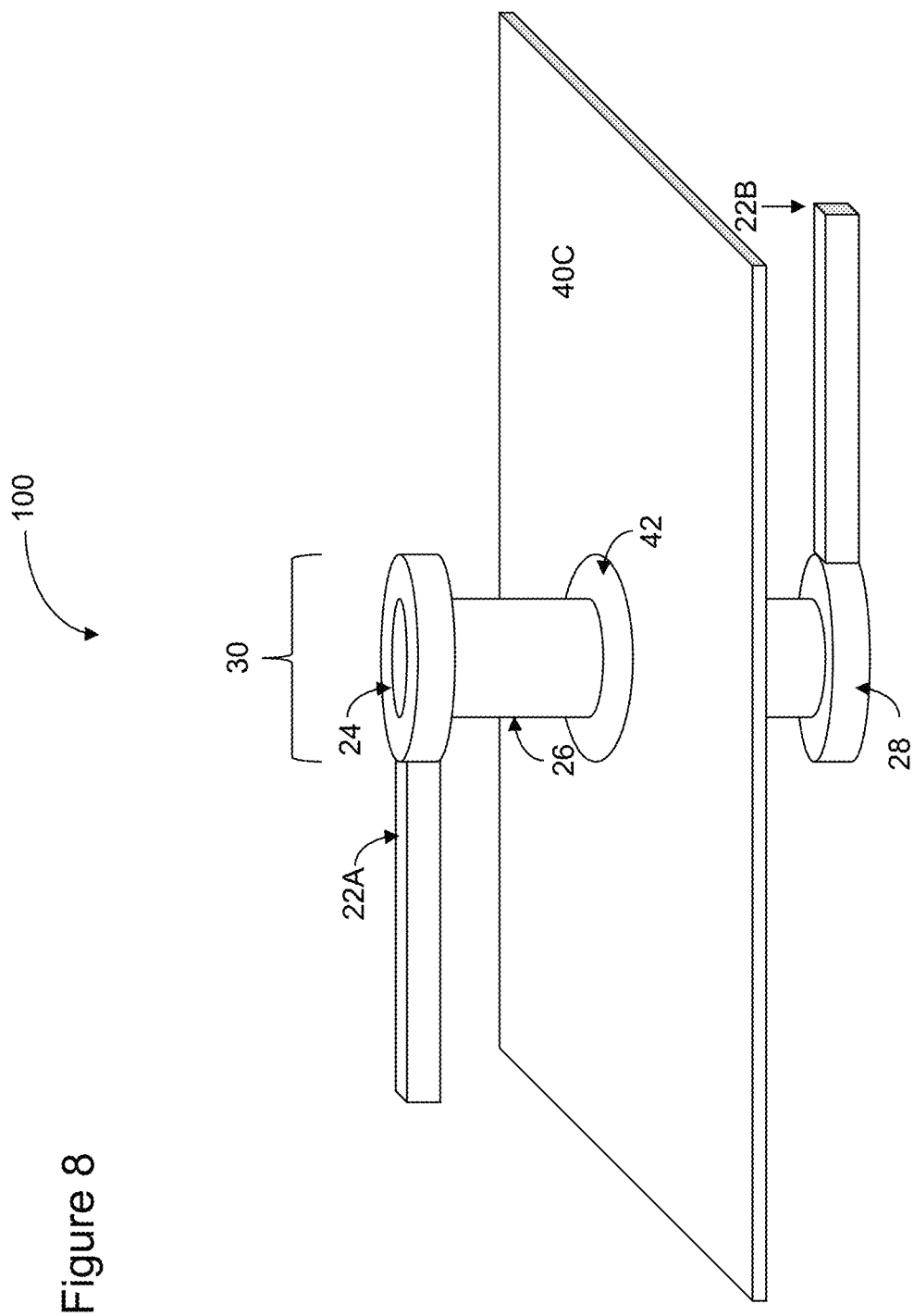
FIG. 8 is a simplified diagram of a via used to illustrate an anti-pad, according to some embodiments.

FIG. 8 is a simplified perspective drawing of a via 30, used to illustrate the anti-pad of the via, according to some embodiments. As before, the via 30 consists of the upper pad 24, the barrel 26, and the lower pad 28, all of which are electrically conductive. The channel 22A connecting the upper pad 24 of the via 30 to a circuit (not shown) is disposed upon a PCB layer (not shown) while the channel 22B connects the lower pad 28 of the via 30 to a second circuit (not shown), which is disposed upon a second PCB layer (not shown). A third PCB layer 40C is shown disposed between the upper pad 24 and the lower pad 26 such that the barrel 26 of the via 30 fits through a hole in the layer. The PCB layer 40C is a board layer in which electrical connection to the via 30 is to be avoided.

An anti-pad 42, made of a material that is not electrically conducting, surrounds the barrel 26 and is disposed upon the top surface of the PCB layer 40C. The anti-pad 42 thus prevents an electrical signal from reaching the layer 40C by way of the via 30. In contrast to the other parts of the via 30 (the top pad 24, the barrel 26, and the lower pad 28), the anti-pad 42 is thus not part of the electrically conducting channel.

Figure 9:
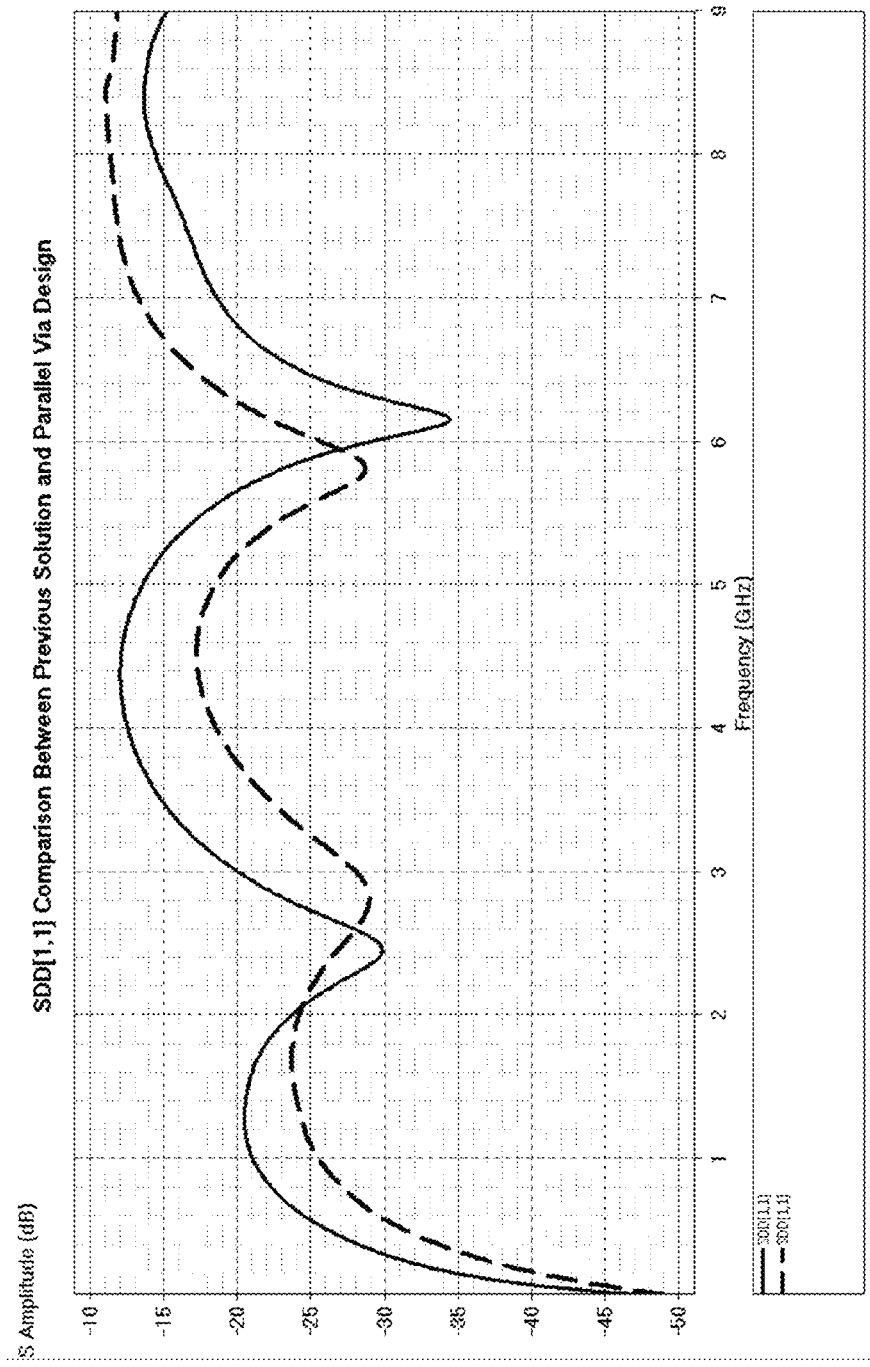
FIG. 9 is a graph comparing the differential return loss of a four-layer PCB-CMC between a single via and the parallel via design of FIG. 4, according to some embodiments.

FIG. 9 is a graph 250 plotting frequency (GHz) versus magnitude (dB), according to some embodiments, for a prior art design using a single via with a 10 mil drill versus the improved design using a parallel via, described herein, according to some embodiments. The graph 250 is showing the differential return loss (SDD11) of the two designs.

Figure 1:
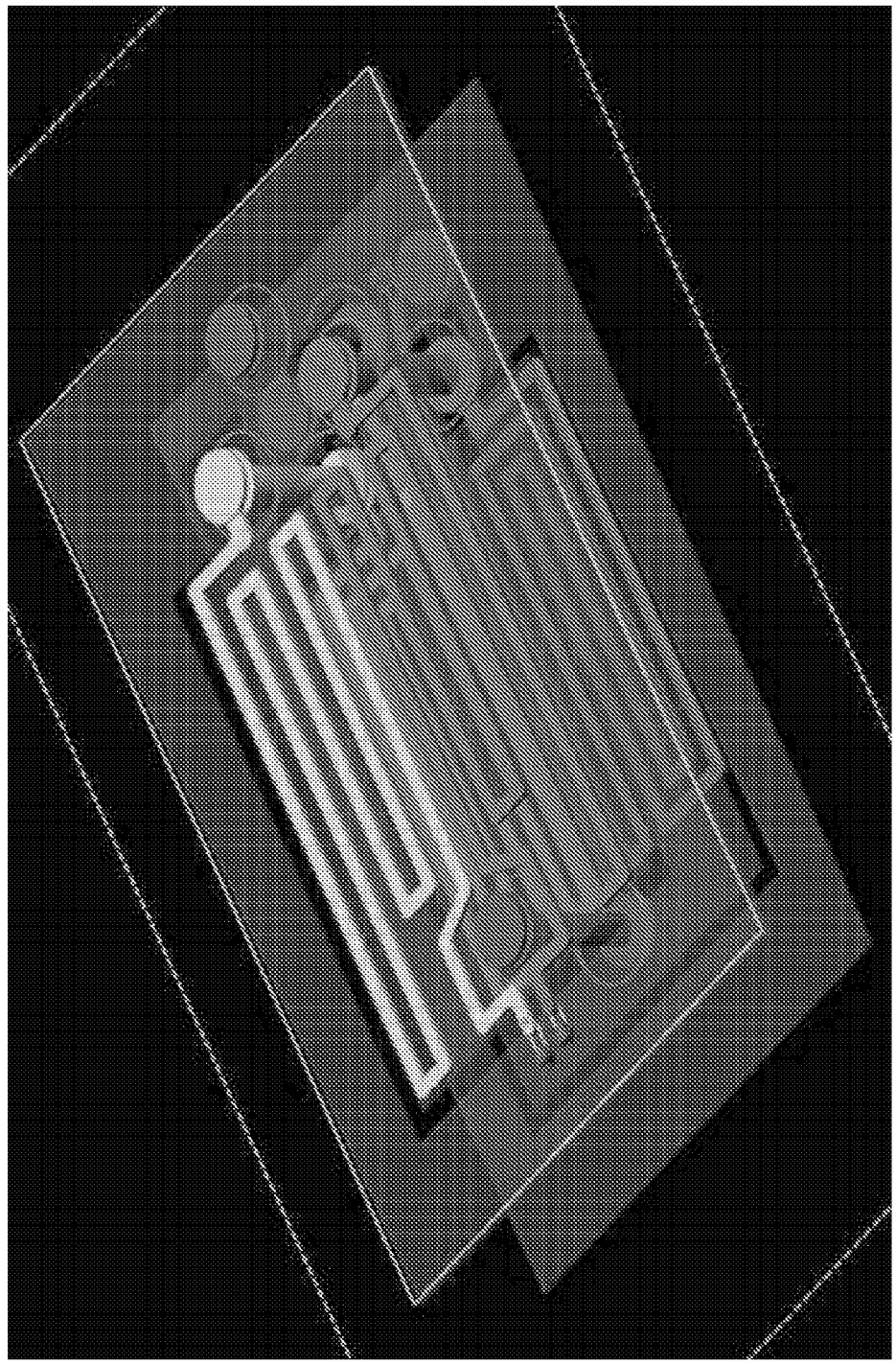
FIG. 1 is a perspective depiction of a PCB-CMC four-layer design used to illustrate a state of the art, according to the prior art.
Figure 2:
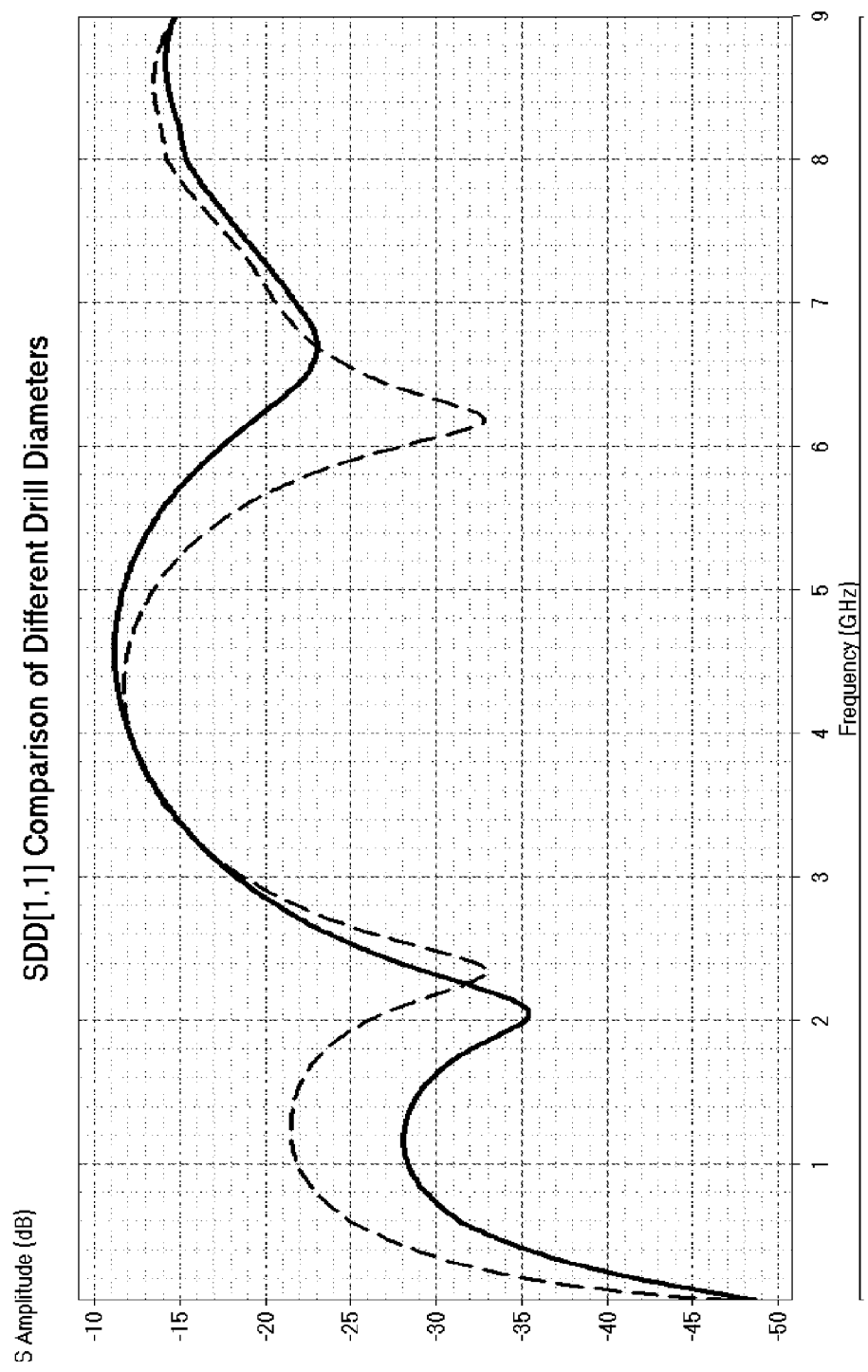
FIG. 2 is a graph comparing the differential return loss of a four-layer PCB-CMC for two different via drill diameters, according to the prior art.
Figure 3:
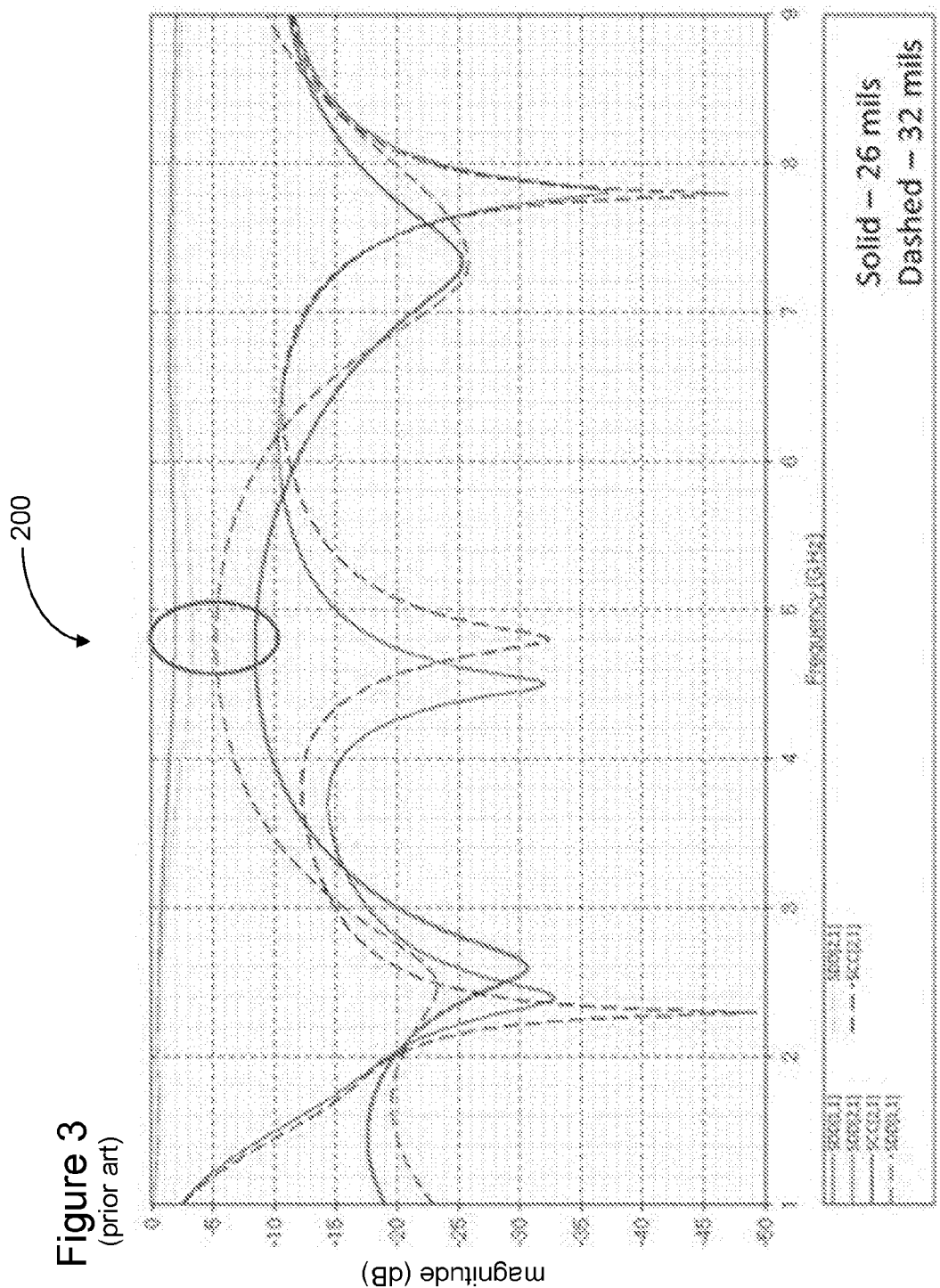
FIG. 3 is a graph comparing the differential return loss of a four-layer PCB-CMC for two different anti-pad sizes, according to the prior art.

Compared to the previous design, the new parallel via design reduces the differential return loss (SDD11) down to −15 dB from DC to 5 GHz, in some embodiments. The improvement is significant. As the return loss can be suppressed under −15 dB, the four-layer PCB-CMC 100 including the parallel vias 30 has a good impedance match and hence can be used in high-speed I/O components. In contrast, the change of drill diameter has little impact to the reflection, as seen from the graph 150 of FIG. 2, above. The tuning of the drill diameter is limited by the manufacturing specifications. Moreover, when the drill diameter is changed, other via geometrical parameters could need changing accordingly, which may counteract the inductance reduction caused by the drill diameter change. The other prior art solution, in which the anti-pad size is reduced, is limited in terms of reducing the differential return loss (reflected energy).

To summarize, the system 100 including parallel vias 30 dramatically outperforms the previous solutions in which drill diameter is adjusted or anti-pad size is adjusted. The system 100, in contrast to prior art four-layer PCB-CMGs, is characterized by a reduction in the return loss, enabling system designers to meet the design specifications of high-speed I/O devices.

Figure 10:
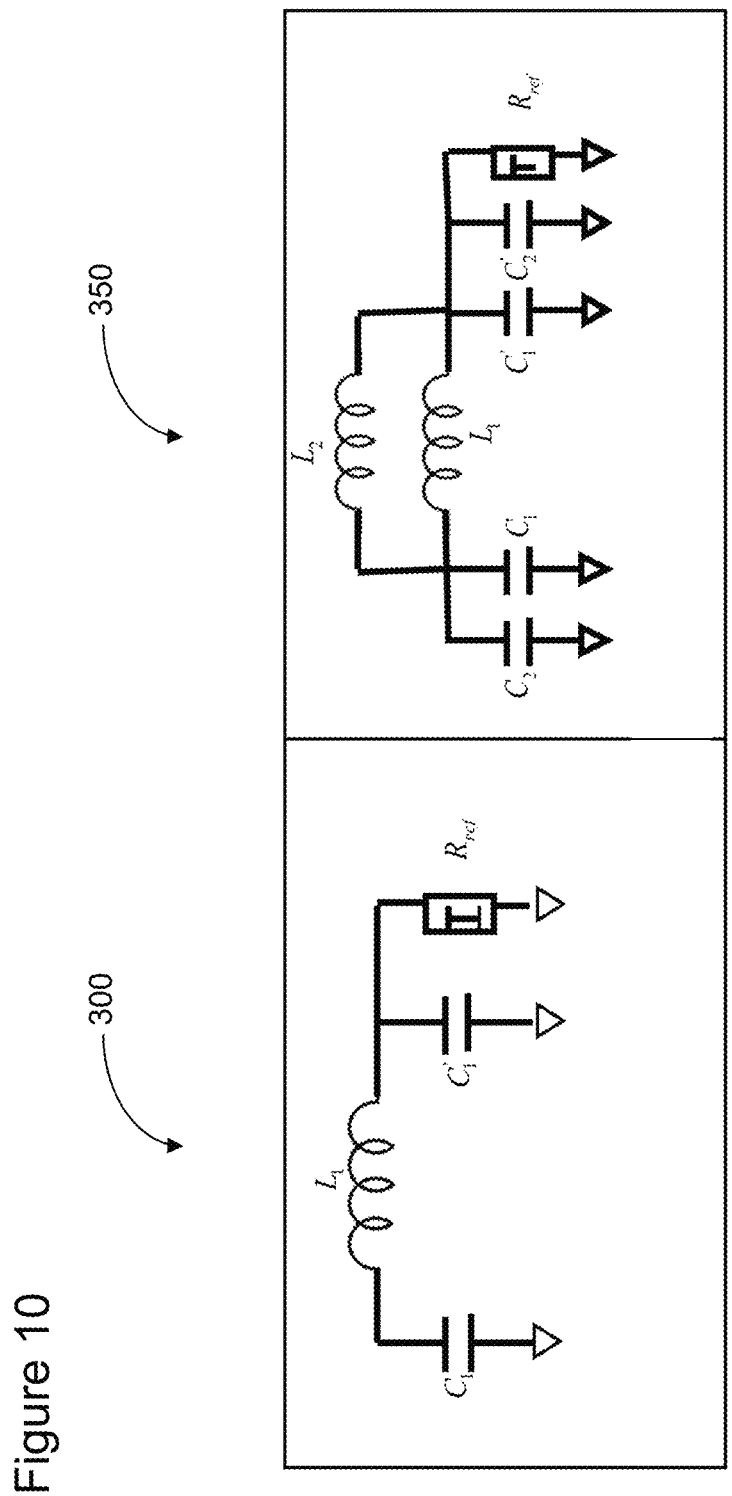
FIG. 10 is an equivalent circuit of a single via and an equivalent circuit of two parallel vias, according to some embodiments.

FIG. 10 depicts two equivalent circuits, a first equivalent circuit 300 for a single via and a second equivalent circuit 350 for a parallel via, such as is used in the system 100 described above. Based on circuit theory, the effective inductance of the parallel via is reduced to half compared with a single via and the effective capacitance is increased to twice. This is a first-order approximation. The analysis is more involved if the distributed parameters of the transmission line are considered.

Figure 11:
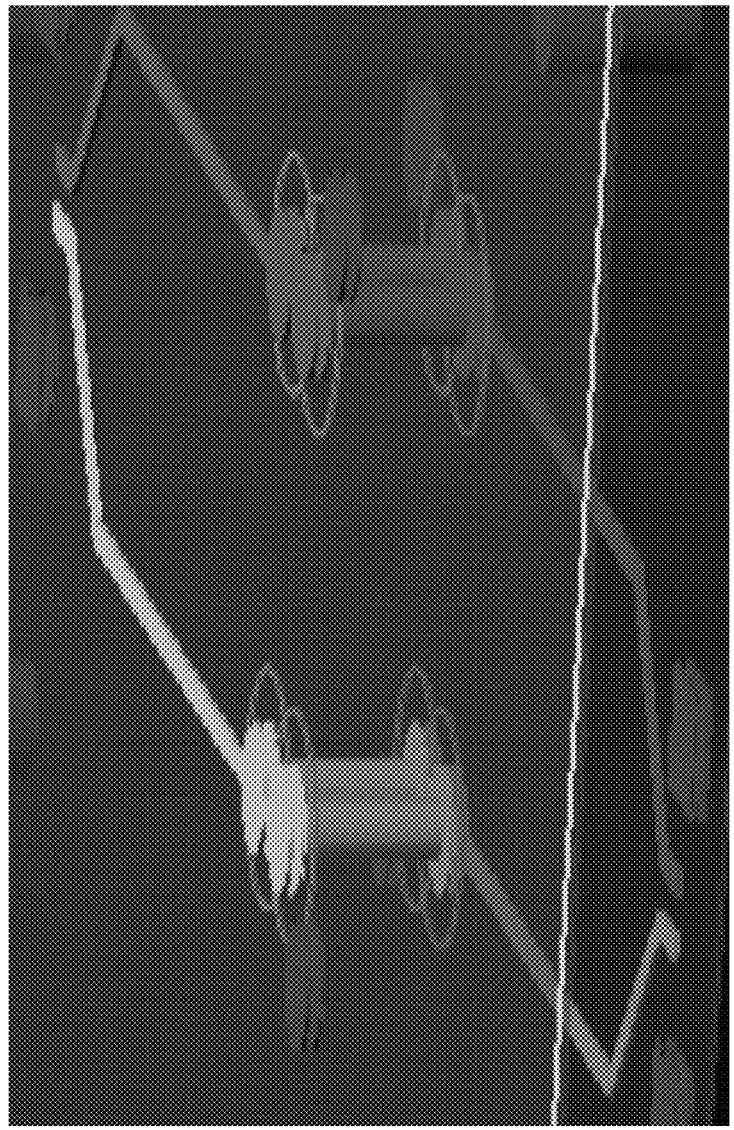
FIG. 11 is a perspective depiction of the parallel via design in which the signal traces of two board layers is visible, according to some embodiments.

FIG. 11 is a perspective drawing of a system 400 of parallel vias being used in a board design, according to some embodiments. The channel through which the electrical signal is transmitted is visible on both layers of the system 400, with the vias 30 providing the transition from one layer to another.

PCB vias introduce discontinuities and often lead to impedance mismatch. In four-layer PCB-CMC, the high reflection caused by the PCB vias is severe. To suppress the reflection and ensure good signal integrity, the electrical properties of the vias have to be well controlled. Tuning the geometrical parameters of one via can be a solution, but its impact is very limited, as described above. Further, tuning one parameter could affect other parameters, which may counteract the impedance mismatch mitigation.

Figure 12:
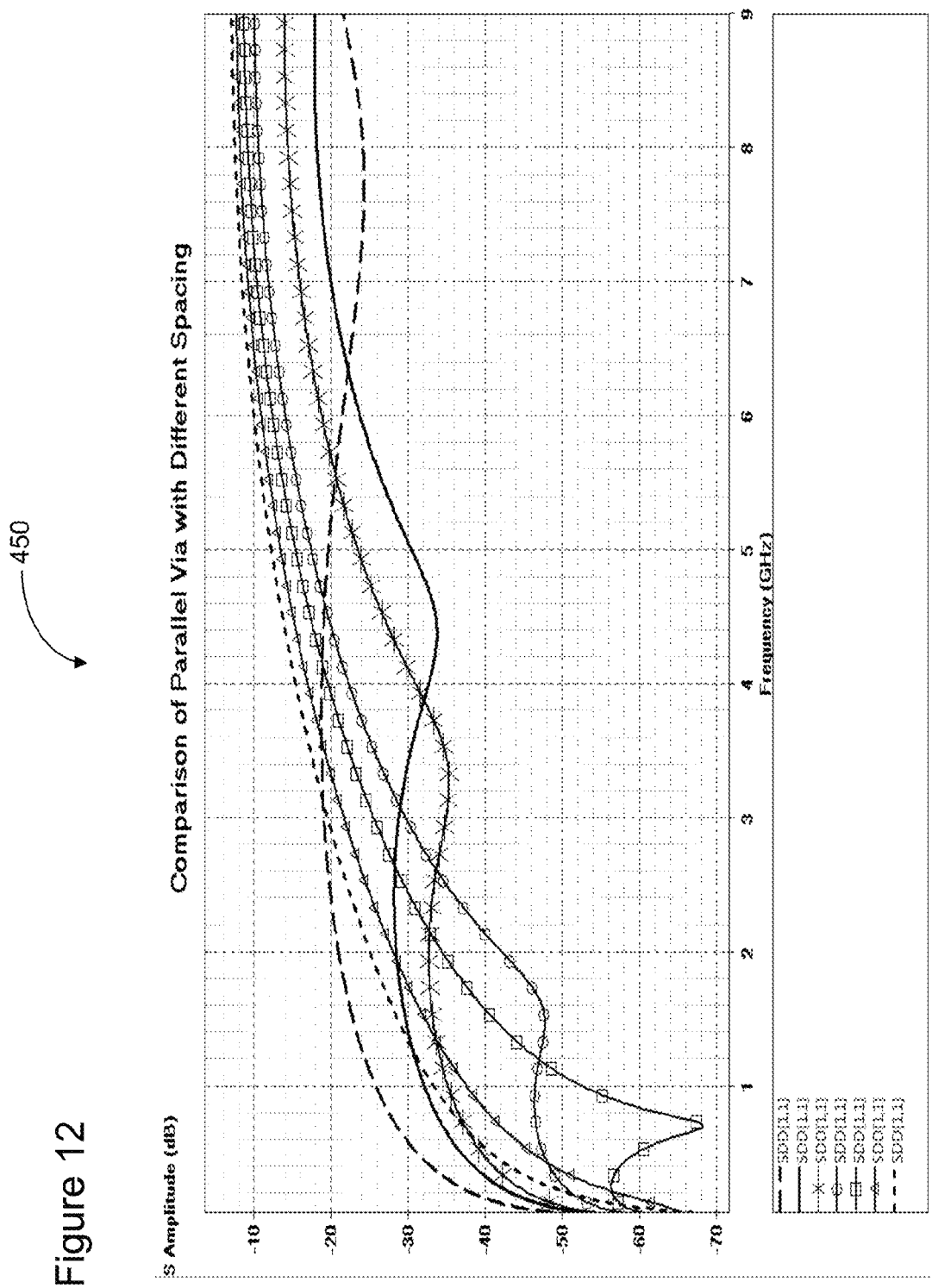
FIG. 12 is a graph comparing the differential return loss of a four-layer PCB-CMC between a single via and two vias having several different diameters, according to some embodiments.

FIG. 12 is a graph 450 comparing the differential return loss of a four-layer PCB-CMC between a single via and two vias having several different diameters, according to some embodiments. The graph 450 shows that the tuning of the diameter of the vias can impact the S parameters (SDD21 and SDD11) obtained in a given design. From FIG. 12, it can be seen that the inductance is smaller if the spacing, D, between the vias is larger, while the capacitance is larger. At frequencies from 4 GHz to 5 GHz, both inductance and capacitance takes effect, and the better impedance match is achieved when the spacing is smaller, in some embodiments.

Figure 13:
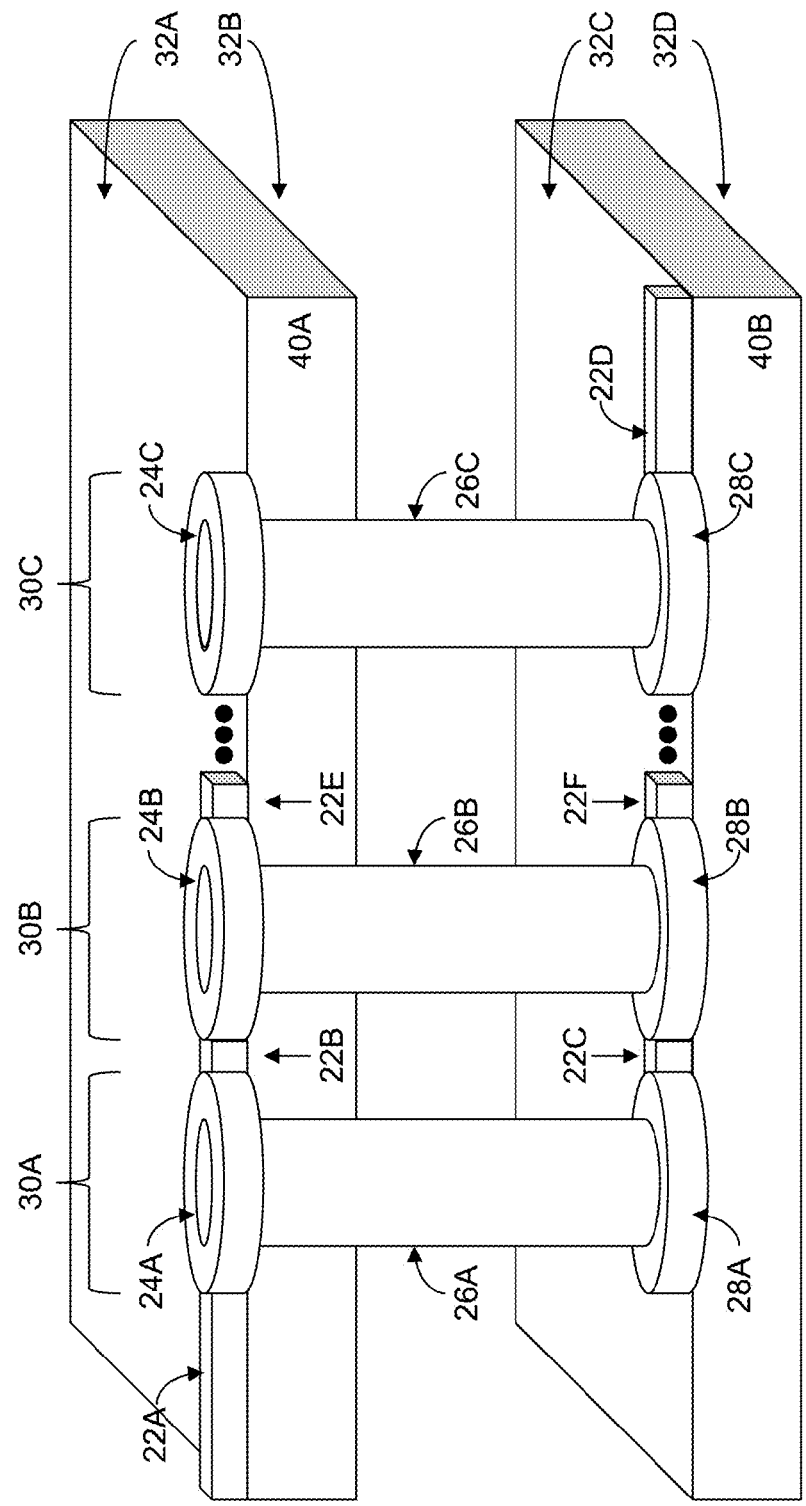
FIG. 13 is a simplified diagram of a parallel via design employing three parallel vias, according to some embodiments.

FIG. 13 is a simplified perspective drawing of a parallel via design in a system 500, according to some embodiments. In contrast to the system 100 of FIG. 4, the system 500 has up to N vias 30A, 30B, . . . , 30C disposed in parallel to one another. In some embodiments, the vias 30A, 30B, . . . , 30C are lined up adjacent to one another to form a line, as illustrated in FIG. 13. In other embodiments, N=3 and the vias 30A, 30B, . . . , 30C are disposed in a triangular arrangement. In still other embodiments, N=4 and the vias are disposed in a rectangular arrangement. The principles described herein can be extended to a three-via design, a four-via design, a five-via design, and so on.

Figure 14:
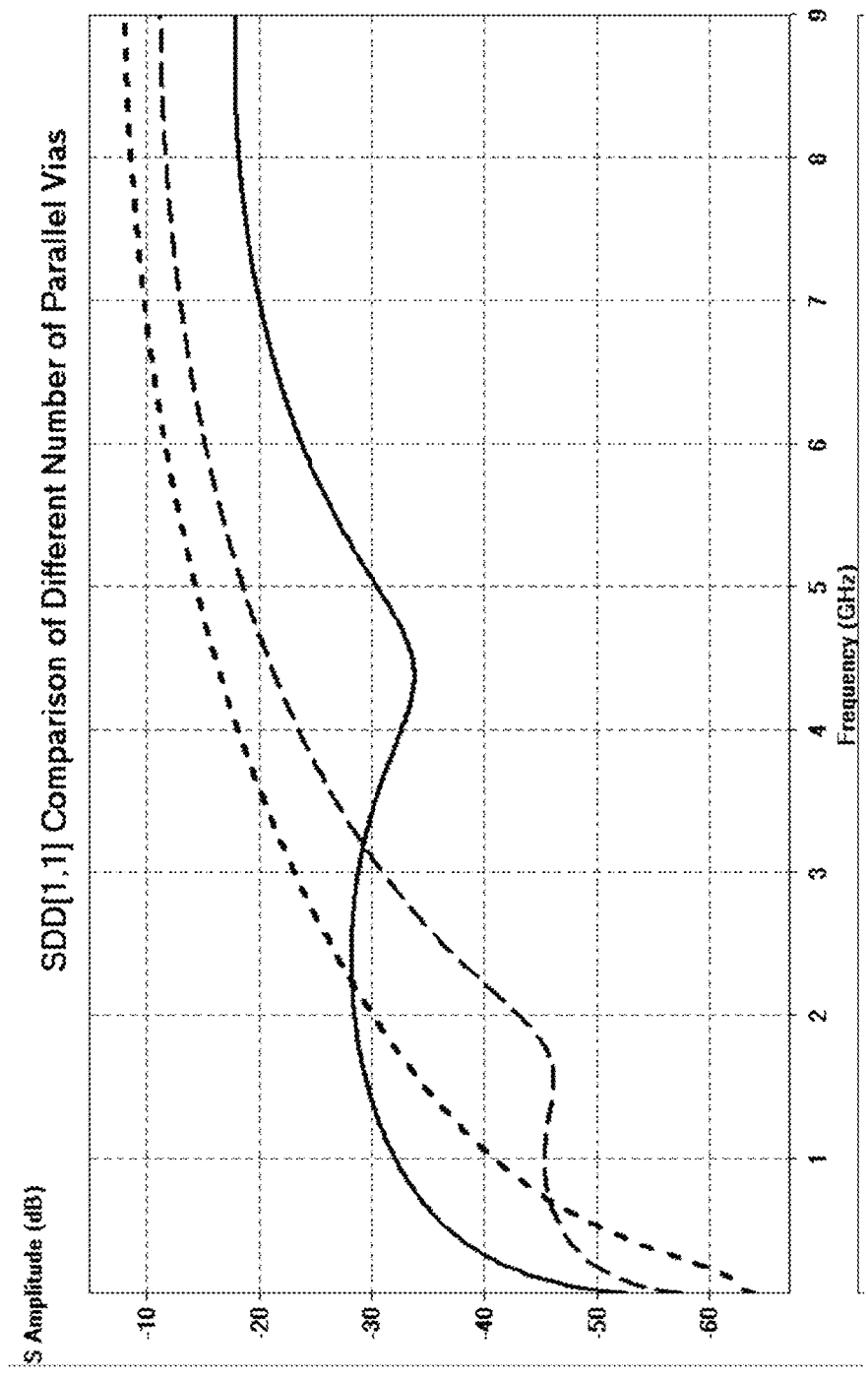
FIG. 14 is a graph comparing the differential return loss of a four-layer PCB-CMC between two-via, three-via, and four-via designs, according to some embodiments.

FIG. 14 is a graph 550 comparing the differential return loss of a four-layer PCB-CMC between a system having two vias, three vias, and four vias, according to some embodiments. The graph 550 shows that the tuning of the number of vias can impact the S parameters (SDD21 and SDD11) obtained in a given design. If the number of vias is increased, the inductance is reduced and the capacitance is increased. At high frequencies of 4-5 GHz, the parallel via pair composed of two vias has the optimal balance of inductance and capacitance, which results in the smallest reflection, in some embodiments.

The graphs herein illustrate that the via physical properties, both the number of vias and the distance between vias, once adjusted, can vary the electrical properties of the system design. Based on the above analysis, the four-layer PCB-CMC using two vias in parallel with a small separation between them is preferred, in some embodiments. Besides the CMC application, the parallel via pair has good potential to be employed in other applications for a desired electrical property by properly choosing the spacing, D, and the number of vias.

The parallel via pair design satisfies the realistic manufacturing constraints of four-layer PCBs, such as dielectric thicknesses, via and pad-stack dimensions, minimum trace width and spacing, etc. The parallel via system 100 (500) can be implemented in a real product using the four-layer PCB-CMC to improve the impedance match for the four-layer PCB-CMC.

The four-layer PCB-CMC responds to customer requests for a solution for their four-layer boards, which are used for low-cost platforms, desktops, and all-in-one systems. Customers are already using the six-layer PCB-CMC and want to be able to use this technology in other platforms, including those using four-layer boards. The four-layer PCB-CMC employing the parallel via pairs reduces platform costs, in some embodiments, while providing support to optimize the EMI and RFI robustness of their systems. The parallel via pair enable a significant reduction in return loss, in some embodiments, without loss of good filter performance.

Figure 15:
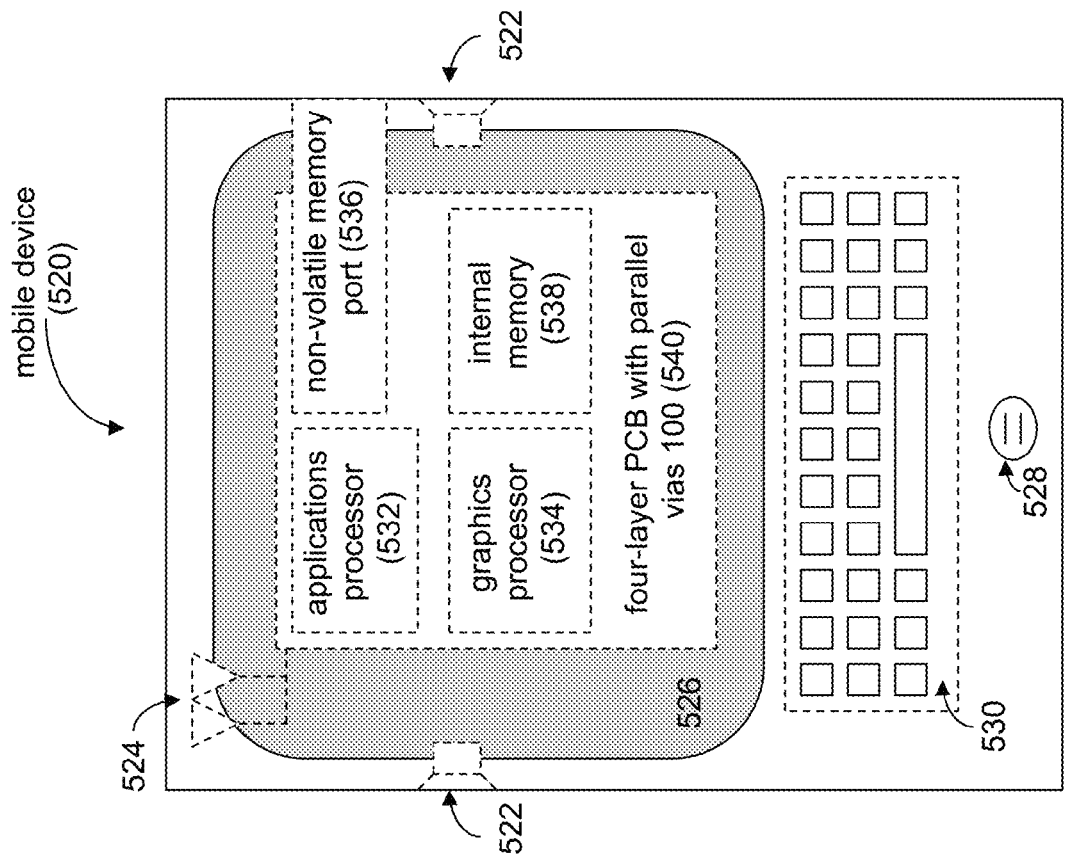
FIG. 15 is a simplified block diagram of a system employing a four-layer PCB-CMC having the parallel via design of FIG. 4, according to some embodiments.

The parallel via design 100 may be employed in a variety of systems and devices, particularly in low-cost designs. Traditional devices such as smart phones and laptops may utilize the design 100, as well as more recent systems such as wearables and Internet of Things (IoT) devices. FIG. 15 is a simplified diagram of a mobile device 520 including a four-layer PCB 540, in which the parallel via design 100 is employed, according to some embodiments. The mobile device 520 is an example illustration of a wireless device, such as a user equipment (UE), a mobile station (MS), a mobile wireless device, a mobile communication device, a tablet, a handset, or other type of wireless device.

In the configuration of FIG. 15, the mobile device 520 includes one or more antennas 524 configured to communicate with a node, such as a base station (BS), an evolved Node B (eNB), a baseband unit (BBU), a remote radio head (RRH), a remote radio equipment (RRE), a relay station (RS), a radio equipment (RE), or other type of wireless wide area network (WWAN) access point. The mobile device 520 can be configured to communicate using at least one wireless communication standard including 3GPP LTE, WiMAX, High Speed Packet Acess (HSPA), Buletooth, and WiFi.

The mobile device 520 includes a microphone 528 and one or more speakers 522 that can be used for audio input to and output from the mobile device. A display screen 526 may be a liquid crystal display (LCD) screen or other type of display screen such as an organic light emitting diode (OLED) display. The display screen can be configured as a touch screen. The touch screen may use capacitive, resistive, or another type of touch screen technology.

The mobile device 520 features a four-layer PCB 540, which includes the parallel vias 100. An application processor 532 and a graphics processor 534 can be coupled to internal memory 538 to provide processing and display capabilities. A non-volatile memory port 536 can also be used to provide data input/output options to a user. The non-volatile memory port 536 may also be used to expand the memory capabilities of the wireless device. A keyboard 530 may be integrated with the mobile device 520 or wirelessly connected to provide additional user input. A virtual keyboard may also be provided using the touch screen.

It should be understood that many of the functional units described in the specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Reference throughout this specification to "an example" or "an embodiment" means that a particular feature, structure, or characteristic described in connection with the example is included in at least one embodiment of the present invention. Thus, appearances of the phrases, "in an example" or "in some embodiments" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples of the present invention may be referred to herein along with alternatives for the various components thereof. It is understood that such embodiments, examples, and alternatives are not to be construed as de facto equivalents of one another, but are to be considered as separate and autonomous representations of the present invention. Furthermore, the described features, structures, or characteristics may be combined in any suitable manner in one or more embodiments.

While the foregoing examples are illustrative of the principles of the present invention in one or more particular applications, it will be apparent to those of ordinary skill in the art that numerous modifications in form, usage, and details of implementation can be made without the exercise of inventive faculty, and without departing from the principles and concepts of the invention. will appreciate numerous modifications and variations therefrom. It is intended that the appended claims cover all such modifications and variations as fall within the true spirit and scope of the invention.

We claim:

1. A system comprising:
    a first PCB layer comprising first traces for differential signals to be transmitted to and from a first circuit disposed on the first PCB layer;
    a second PCB layer comprising second traces for differential signals to be transmitted to and from a second circuit disposed on the second PCB layer, the second PCB layer being different from the first PCB layer;
    a common mode choke (CMC) filter disposed on either the first traces or the second traces; and
    two parallel vias to couple the first traces to the second traces, the two parallel vias being disposed orthogonal to the first traces and the second traces, the two parallel vias being at a predetermined distance from one another, wherein the first traces, the two parallel vias, and the second traces comprise a channel between the first circuit and the second circuit;
    wherein differential signals transmitted at high speeds in the channel are characterized by an increase in capacitance and a decrease in inductance relative to a second channel having a single via.

2. The system of claim 1, wherein differential signals traveling on the first traces and signals traveling on the second traces of the channel are characterized by a minimal reflection relative to the second channel.

3. The system of claim 1, wherein the differential signals are transmitted at between 4 and 5 GigaHertz.

4. The system of claim 1, wherein the differential signals are transmitted at between 0 and 7.5 GigaHertz.

5. The system of claim 1, wherein the predetermined distance is selected from a group consisting of 20 mils, 30 mils, 40 mils, 50 mils, 60 mils, and 70 mils, wherein a mil is one one-thousanth of an inch.

6. The system of claim 1, wherein impedance of the two parallel vias is controlled within a predetermined frequency range by adjusting the predetermined distance.

7. The system of claim 1, further comprising:
    a third via disposed adjacent to the two parallel vias, the third via also being disposed orthogonal to the first traces and the second traces, wherein the first traces, the two parallel vias plus the third via, and the second traces comprise the channel between the first circuit and the second circuit.

8. The system of claim 7, wherein the third via is disposed the predetermined distance from the two parallel vias.

9. The system of claim 8, wherein impedance of the two parallel vias plus the third via is controlled within a predetermined frequency range by adjusting the predetermined distance.

10. The system of claim 7, wherein the third via is disposed a second predetermined distance from the two parallel vias, wherein impedance of the two parallel vias plus the third via is controlled within a predetermined frequency range by adjusting the predetermined distance and the second predetermined distance.

11. A system comprising:
    a first PCB layer comprising first traces for differential signals to be transmitted to and from a first circuit disposed on the first PCB layer;
    a second PCB layer comprising second traces for differential signals to be transmitted to and from a second circuit disposed on the second PCB layer, the second PCB layer being different from the first PCB layer;
    a common mode choke (CMC) filter disposed on either the first traces or the second traces;
    a first via to couple the first traces to the second traces, the first via being disposed orthogonal to the first traces and the second traces, wherein the first traces, the first via, and the second traces comprise a channel between the first circuit and the second circuit, the channel comprising a first inductance and a first capacitance; and
    a second via to couple the first traces to the second traces, the second via being parallel and adjacent to the first via, the second via being a predetermined distance from the first via, wherein the first traces, the first via, the second via, and the second traces comprise a second channel between the first circuit and the second circuit, the second channel comprising a second inductance and a second capacitance;
    wherein the second inductance is lower than the first inductance and the second capacitance is higher than the first capacitance.

12. The system of claim 11, wherein differential signals transmitted at high speeds in the first channel are reflected but are not reflected in the second channel.

13. The system of claim 12, wherein differential signals transmitted at high speeds are differential signals transmitted at between 1 and 9 GigaHertz.

14. The system of claim 11, wherein the predetermined distance is 20 mils, wherein a mil is one one-thousanth of an inch.

15. The system of claim 11, wherein the predetermined distance is 30 mils, wherein a mil is one one-thousanth of an inch.

16. The system of claim 11, wherein the predetermined distance is 70 mils, wherein a mil is one one-thousanth of an inch.

17. The system of claim 11, wherein impedance of the first via and the second via is controlled within a predetermined frequency range by adjusting the predetermined distance between the first via and the second via.

18. The system of claim 11, wherein there is an impedance match between differential signals traveling on the first traces and signals traveling on the second traces of the second channel.

19. The system of claim 11, further comprising:
a third via disposed adjacent to either the first via or the second via, the third via also being disposed orthogonal to the first traces and the second traces, the third via being at the predetermined distance from either the first via or the second via, wherein the first traces, the first via, the second via, the third via, and the second traces comprise a third channel between the first circuit and the second circuit, the third channel comprising a third inductance and a third capacitance;
wherein the third inductance is lower than the first inductance and the third capacitance is higher than the first capacitance.

* * * * *